US006211601B1

(12) United States Patent
Obara

(10) Patent No.: US 6,211,601 B1
(45) Date of Patent: Apr. 3, 2001

(54) MULTI-TUNED ACOUSTIC CYLINDRICAL PROJECTOR

(75) Inventor: Robert J. Obara, Portsmouth, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/038,483

(22) Filed: Mar. 4, 1998

(51) Int. Cl.[7] .................................................... H01L 41/08

(52) U.S. Cl. .......................... 310/317; 310/334; 310/337; 310/369

(58) Field of Search ............................ 310/317, 334–337, 310/369

(56) References Cited

U.S. PATENT DOCUMENTS

| | | | | |
|---|---|---|---|---|
| 2,102,668 | * | 12/1937 | Ballantine | 310/317 X |
| 2,985,003 | * | 5/1961 | Gelfand et al. | 310/317 X |
| 3,068,446 | * | 12/1962 | Ehrlich et al. | 310/337 X |
| 3,100,886 | * | 8/1963 | Marks | 310/317 X |
| 3,177,382 | * | 4/1965 | Green | 310/337 X |
| 3,922,572 | * | 11/1975 | Cook et al. | 310/337 X |
| 3,980,905 | * | 9/1976 | Miller | 310/317 |
| 4,209,766 | * | 6/1980 | Teel | 310/337 X |
| 4,220,887 | * | 9/1980 | Kompanek | 310/337 X |
| 4,439,847 | * | 3/1984 | Massa | 310/337 X |
| 4,752,918 | * | 6/1988 | Boucher et al. | 310/337 X |
| 4,754,441 | * | 6/1988 | Butler | 310/337 X |
| 5,081,391 | * | 1/1992 | Owen | 310/337 X |
| 5,220,538 | * | 6/1993 | Flanagan et al. | 310/337 X |
| 5,431,058 | * | 7/1995 | Lagier et al. | 310/337 X |

* cited by examiner

*Primary Examiner*—Mark O. Budd
(74) *Attorney, Agent, or Firm*—Michael J. McGowan; Robert W. Gauthier; Prithvi C. Lall

(57) ABSTRACT

A system and method for operating a cylindrical acoustic projector is provided which allows efficient operation of the projector over a wide bandwidth. The system and method use multiple power amplifiers each tuned to operate over separate and narrow bandwidths, the number of seperate bandwidths corresponding to the number of amplifiers such that the total bandwidth is covered. Each tuning network assembly includes the power amplifier, a transformer and a tuning inductor, with the tuning inductor selected for proper tuning over the frequency bands the amplifier is to operate at. The narrow bandwidths for each power amplifier result in a substantial reduction in the reactive power dissipated in the amplifiers and also the total power consumption of the acoustic projector.

8 Claims, 6 Drawing Sheets

MULTI-TUNED ACOUSTIC CYLINDRICAL PROJECTOR

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention relates generally to acoustic projectors, and more particularly to a system and method for operating acoustic projectors over a wide bandwidth while reducing the power supplied and dissipated.

(2) Description of the Prior Art

Acoustic projectors of the type having multiple ceramic elements are used to provide wide bandwidth operation. Such projectors are normally powered by an amplifier tuned to the center of the frequency band of operation. For example, U.S. Pat. No. 4,652,786 to Mishiro recites a torsional vibration apparatus having a plurality of electrodes formed on the two surfaces of a circular member of electrostrictive material. Adjacent electrodes are simultaneously polarized so as to be mutually reversed in a circumferential direction. The electrodes essentially form multiple elements from the circular member. A high frequency voltage is tuned to the slide resonance frequency and impressed on the apparatus to induce resonant vibration. The electrodes are connected to a power supply through a transformer having the primary coil connected to the power supply, the midpoint of the secondary coil connected to ground and the ends of the secondary coil connected to the segmented electrodes in an alternating manner such that adjacent electrodes have opposite polarity. In a stack configuration, the ends of the secondary coil would be connected at each end of the stack. The power amplifier load at the frequency band edges is highly reactive with a large phase angle. This results in the power amplifier and its power source supplying substantial amounts of reactive power to the projector, with power being dissipated in the amplifier. A need exists to operate acoustic projectors more efficiently over a wide bandwidth.

SUMMARY OF THE INVENTION

Accordingly, it is an object of the present invention to provide a system and method to operate an acoustic projector more efficiently over a wide bandwidth.

Another object of the present invention is to provide a system and method to operate an acoustic projector which reduces the power dissipated in the amplifiers.

Still another object of the present invention is to provide a system and method to operate an acoustic projector which reduces the power supply requirements of the projector.

Other objects and advantages of the present invention will become more obvious hereinafter in the specification and drawings.

In accordance with the present invention, a system and method for operating an acoustic projector is provided which allows efficient operation of the projector over a wide bandwidth. The system and method use multiple tuning network assemblies each operating over separate and narrow bandwidths. Each tuning network assembly has a power amplifier, a transformer and a tuning inductor. The tuning inductor for each tuning network assembly is selected for proper tuning over the frequency bands for that assembly. The number of separate bandwidths corresponds to the number of amplifiers such that the total bandwidth is covered. As is well known in the art, the narrower bandwidths for each power amplifier will result in substantial reductions in the reactive power dissipated in the amplifiers and also in the total power consumption of the acoustic projector.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein corresponding reference characters indicate corresponding parts throughout the several views of the drawings and wherein.

DESCRIPTION OF THE PREFERRED EMBODIMENT

Figure 1:
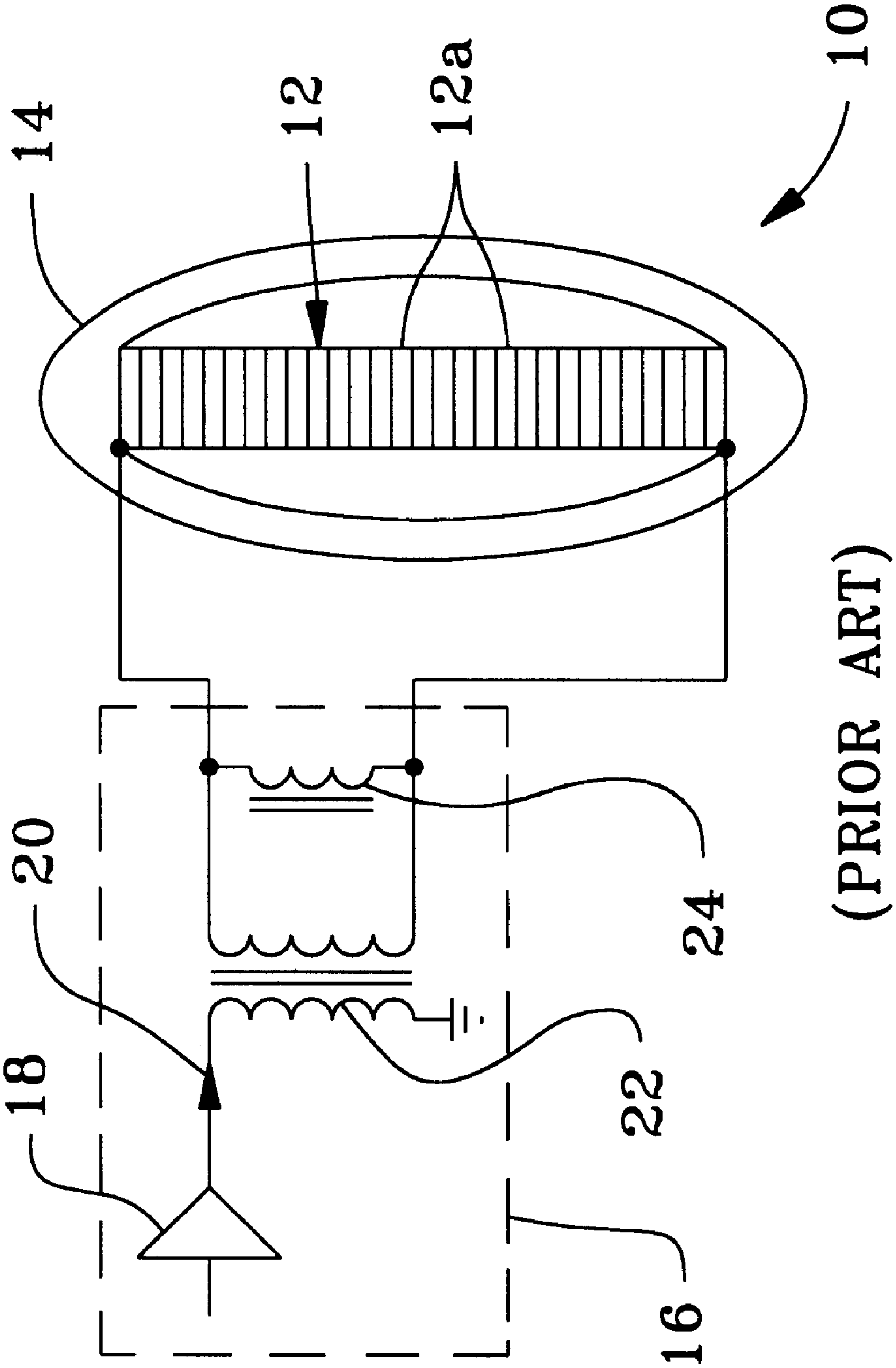
(PRIOR ART) FIG. 1
FIG. 1 is a prior art flextensional acoustic projector.

Referring now to FIG. 1, there is shown a schematic representation of a prior art wide bandwidth flextensional acoustic projector 10. Acoustic projector 10 has a stack 12 of ceramic elements 12*a* enclosed within shell 14. Typically, acoustic projector 10 is driven through a tuning network assembly 16 which applies a tuned voltage across stack 12. Tuning network assembly 16 includes power amplifier 18, which provides an input signal, indicated by arrow 20, corresponding to the bandwidth. Transformer 22 receives signal 20 and provides a voltage output which is tuned to the center of the frequency band of operation by tuning inductor 24.

Figure 2A:
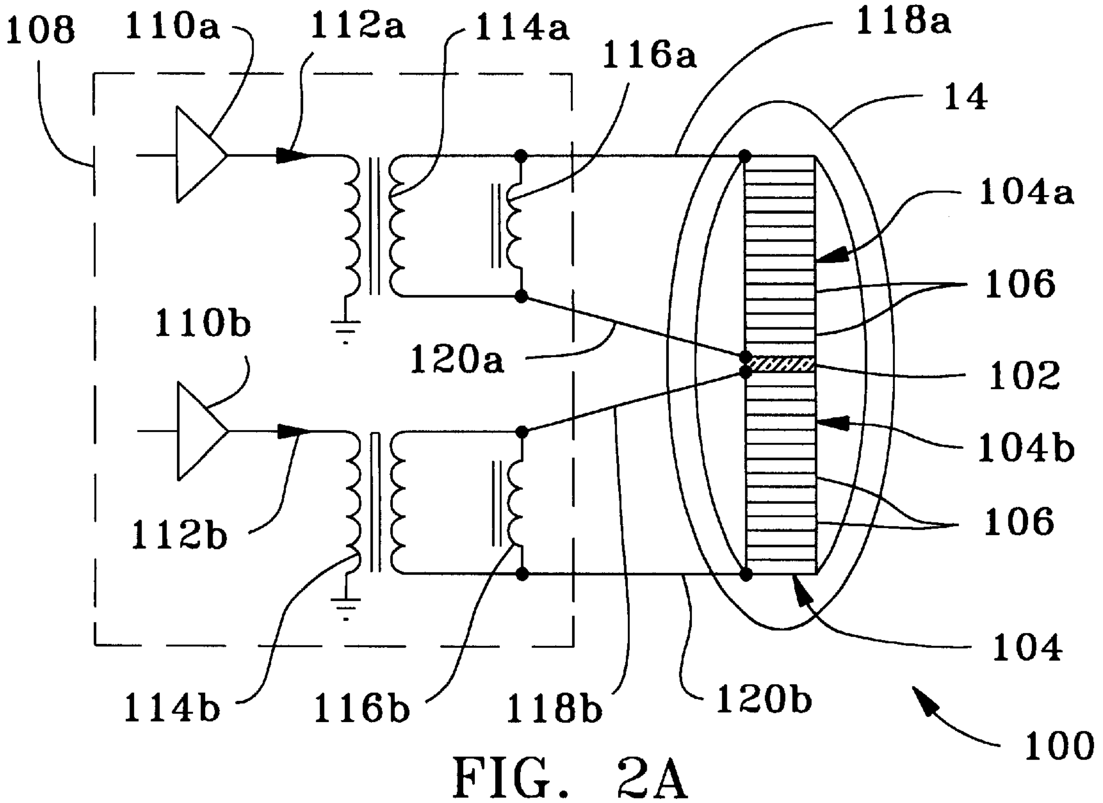
FIG. 2A is a schematic representation of the system of the present invention for operating a flextensional acoustic projector configured for parallel tuning.
Figure 2B:
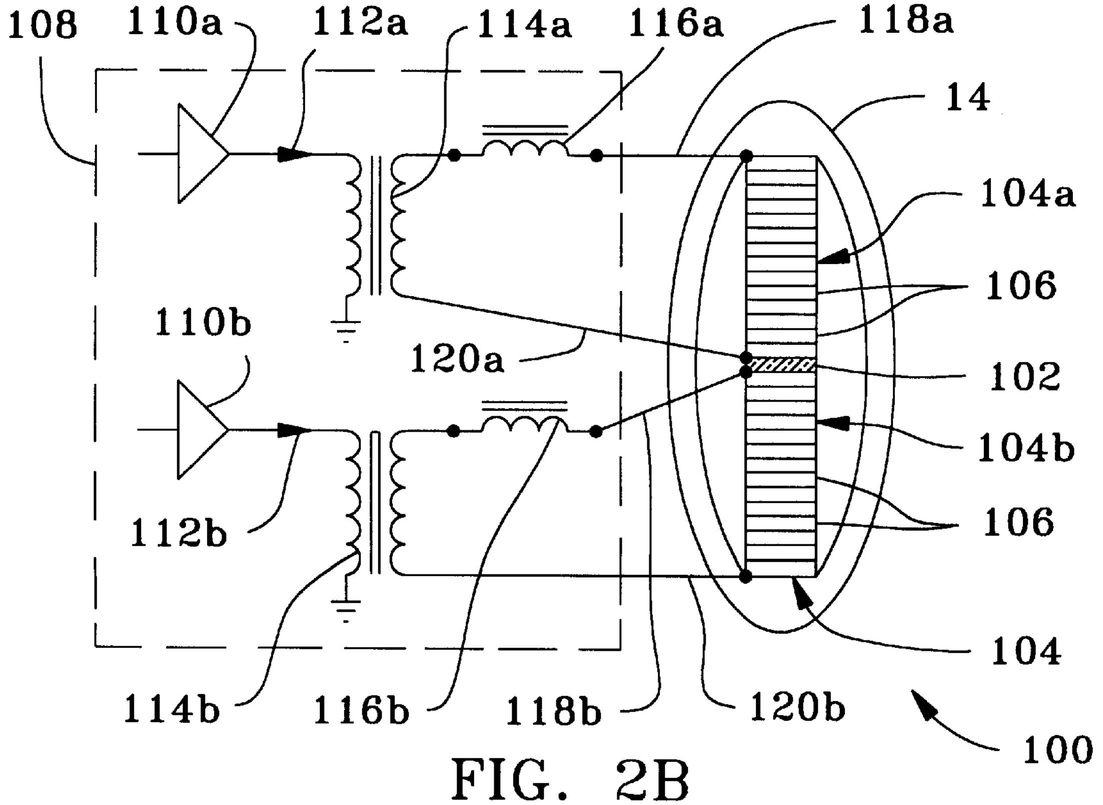
FIG. 2B is a schematic representation of the system of the present invention for operating a flextensional acoustic projector configured for series tuning.

Referring now to FIGS. 2A and 2B, there is shown a schematic representation of a multi-tuned flextensional acoustic projector 100 utilizing the system of the present invention. Electrical isolation element 102 is positioned within the stack 104, thus forming upper stack 104*a* and lower stack 104*b*, each consisting of multiple ceramic elements 106. The location of isolation element 102 within the stack will depend on the acoustic properties of projector 100 and the desired acoustic signal. Acoustic projector 100 is driven by tuning network assembly 108 having two power amplifiers 110*a* and 110*b*. Each power amplifier provides a signal, indicated by arrows 112*a* and 112*b*, corresponding to a portion of the bandwidth, such that the total bandwidth is represented by signals 112*a* and 112*b*. Transformers 114*a* and 114*b* receive signals 112*a* and 112*b*, respectively and provide a voltage output. The voltage output of transformer 114*a* is tuned by tuning inductor 116*a* to the center of the portion of the bandwidth for signal 112*a*. Similarly, the voltage output of transformer 114*b* is tuned by tuning inductor 116*b* to the center of the portion of the bandwidth for signal 112*b*. In FIG. 2A, tuning inductors 116*a* and 116*b* are shown in a parallel tuning configuration. In FIG. 2B, tuning inductors 116*a* and 116*b* are shown in a series configuration. The tuned voltage from inductor 116*a* is applied across upper stack 104*a* via electrical connections 118*a* and 120*a*, while the tuned voltage from inductor 116*b* is applied over lower stack 104*b* via electrical connections 118*b* and 120*b*. When compared with prior art acoustic projector 10 of FIG. 1, the reactive power supplied by amplifiers 110*a* and 110*b* is considerably less than that supplied by amplifier 18. As an example, this system or technique could be utilized for a single projector to transmit two widely separated (in frequency) continuous wave tones with almost no reactive power generated.

Figure 3:
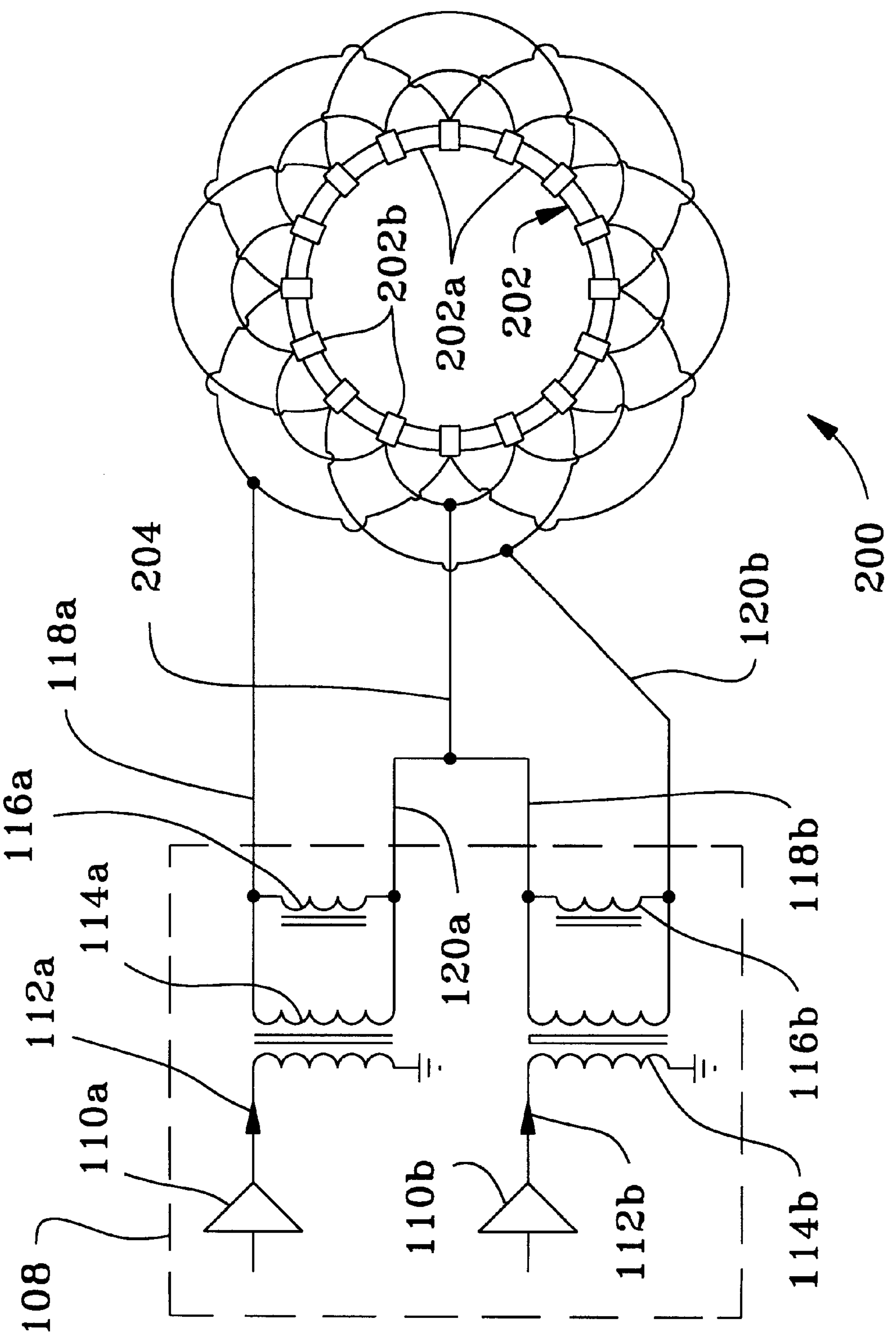
FIG. 3 is a schematic representation of the system of the present invention for operating a cylindrical acoustic projector.
Figure 4A:
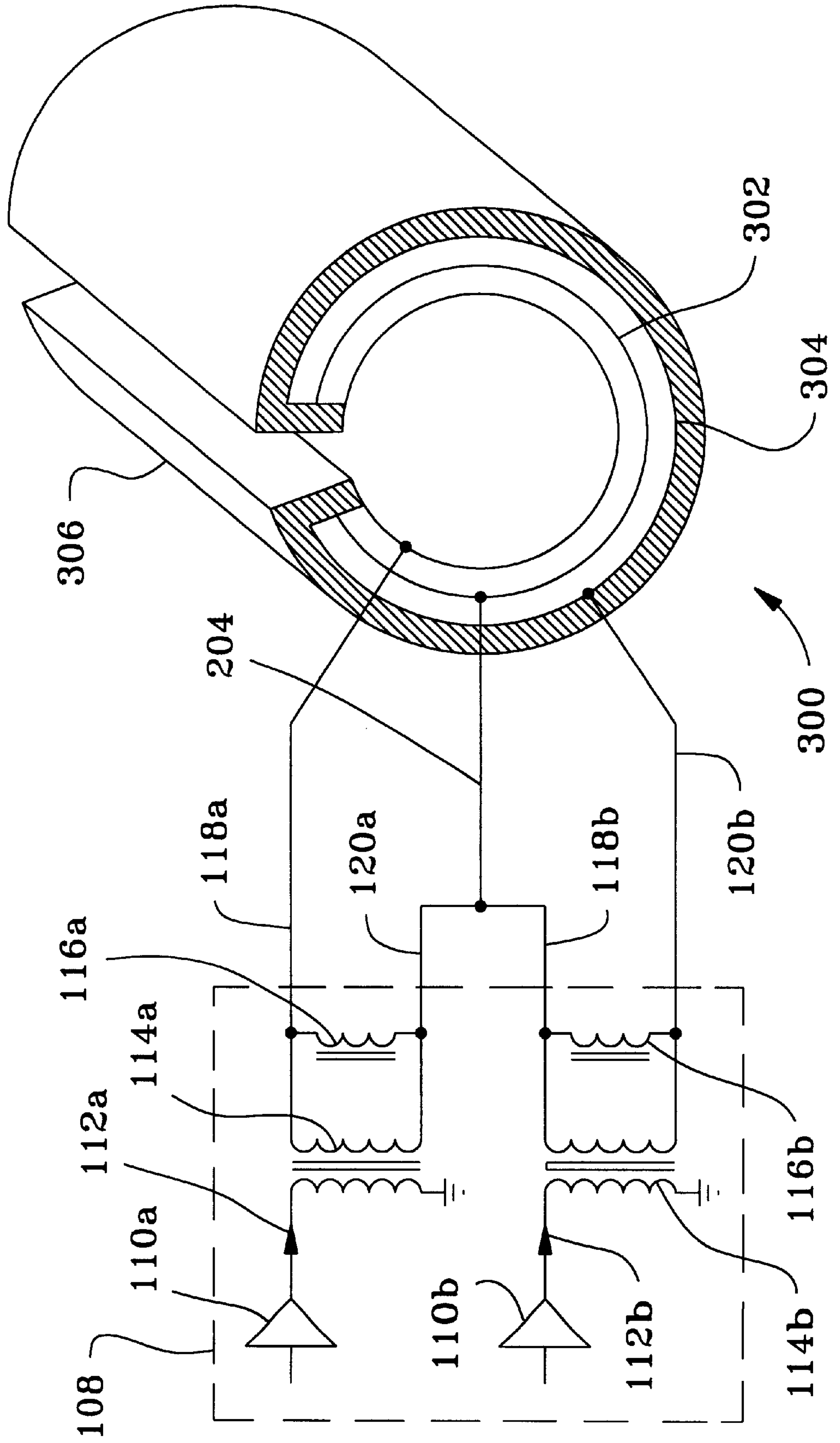
FIG. 4A is a schematic representation of the system of the present invention for operating a split-ring acoustic projector.
Figure 4B:
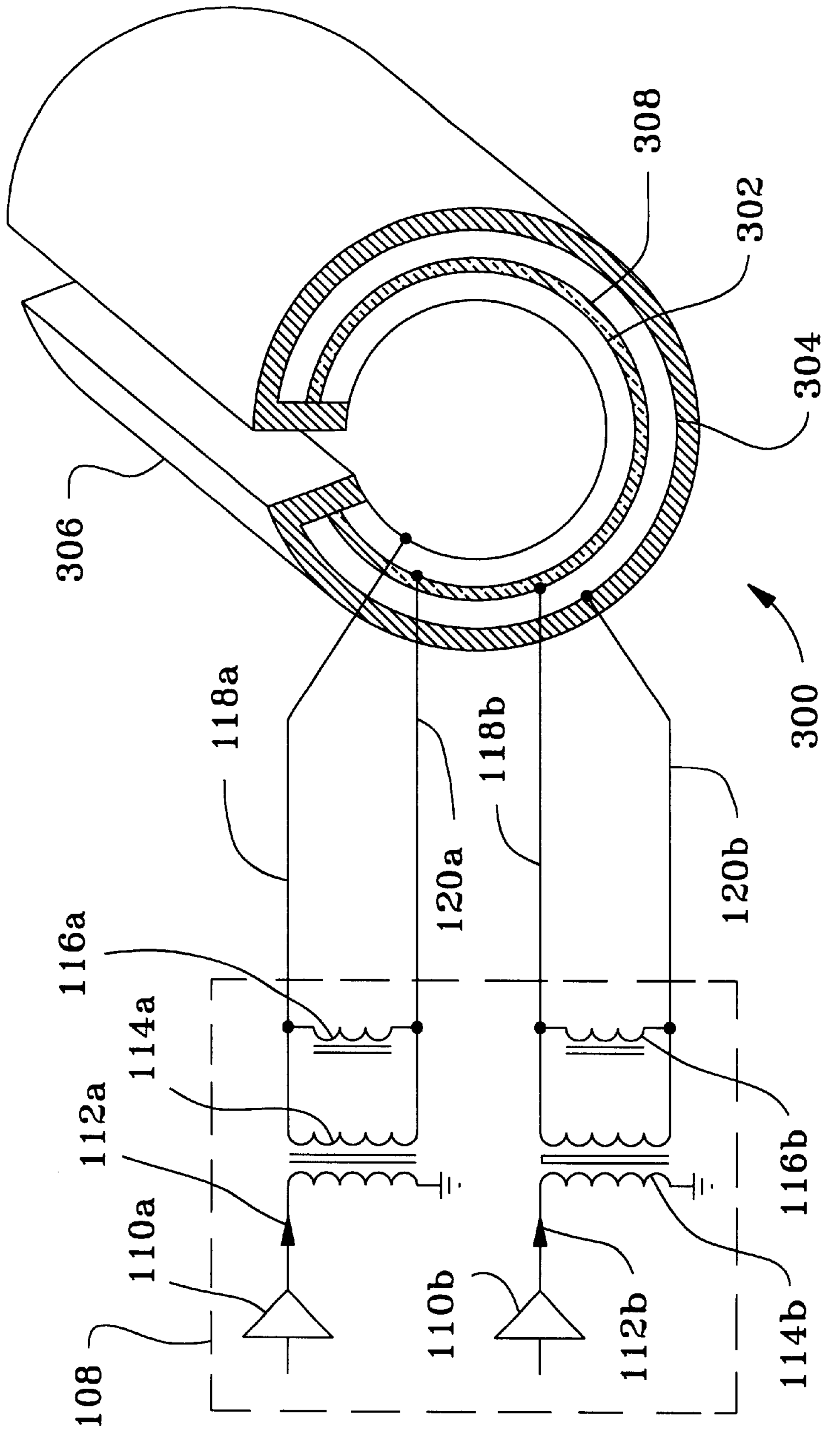
FIG. 4B is a schematic representation of the system of the present invention for operating a split-ring acoustic projector having an electrical isolation element.

The system of providing a multi-tuned acoustic projector can be used with other types of acoustic projectors. FIG. 3 shows a schematic representation of the preferred embodiment for multi-tuned cylindrical acoustic projector 200. Projector 200 consists of a tangentially polarized ceramic cylinder 202 having multiple ceramic elements 202*a* alternating circumferentially with conductive stripes 202*b*, as is well known in the art. Tuning network assembly 108 is used to drive projector 200 with connections 118*a* and 120*a* driving two adjacent ceramic elements 202*a* and connections 118*b* and 120*b* driving alternating pairs of ceramic elements 202*a*. It can be seen that leads 120*a* and 118*b* feed the same alternating conductive stripes 202*b* and thus can be connected into a single lead 204. Leads 118*a* and 120*b* connect to every fourth conductive stripe 202*b*, such that the pattern (118*a*, 204, 120*b*, 204) of feeds to conductive stripes 202*b* is repeated four times about the cylinder. FIG. 4A shows a schematic representation of multi-tuned split ring projector 300 having an inner ceramic ring 302 surrounded by adjacent outer ceramic ring 304, which in turn is surrounded by shell 306. In this configuration, tuned voltage from inductor 116*a* is applied over inner ceramic ring 302 and tuned voltage from inductor 116*b* is applied over adjacent outer ceramic ring 304. As in FIG. 3, leads 120*a* and 118*b* are connected to form lead 204. FIG. 4B shows a schematic representation of multi-tuned split ring projector 300 having electrical isolation ring element 308 between inner ceramic ring 302 and outer ceramic ring 304. Again, tuned voltage from inductor 116*a* is applied over inner ceramic ring 302 and tuned voltage from inductor 116*b* is applied over adjacent outer ceramic ring 304. However, leads 120*a* and 118*b* are not connected due to the presence of isolation ring element 308.

Figure 5:
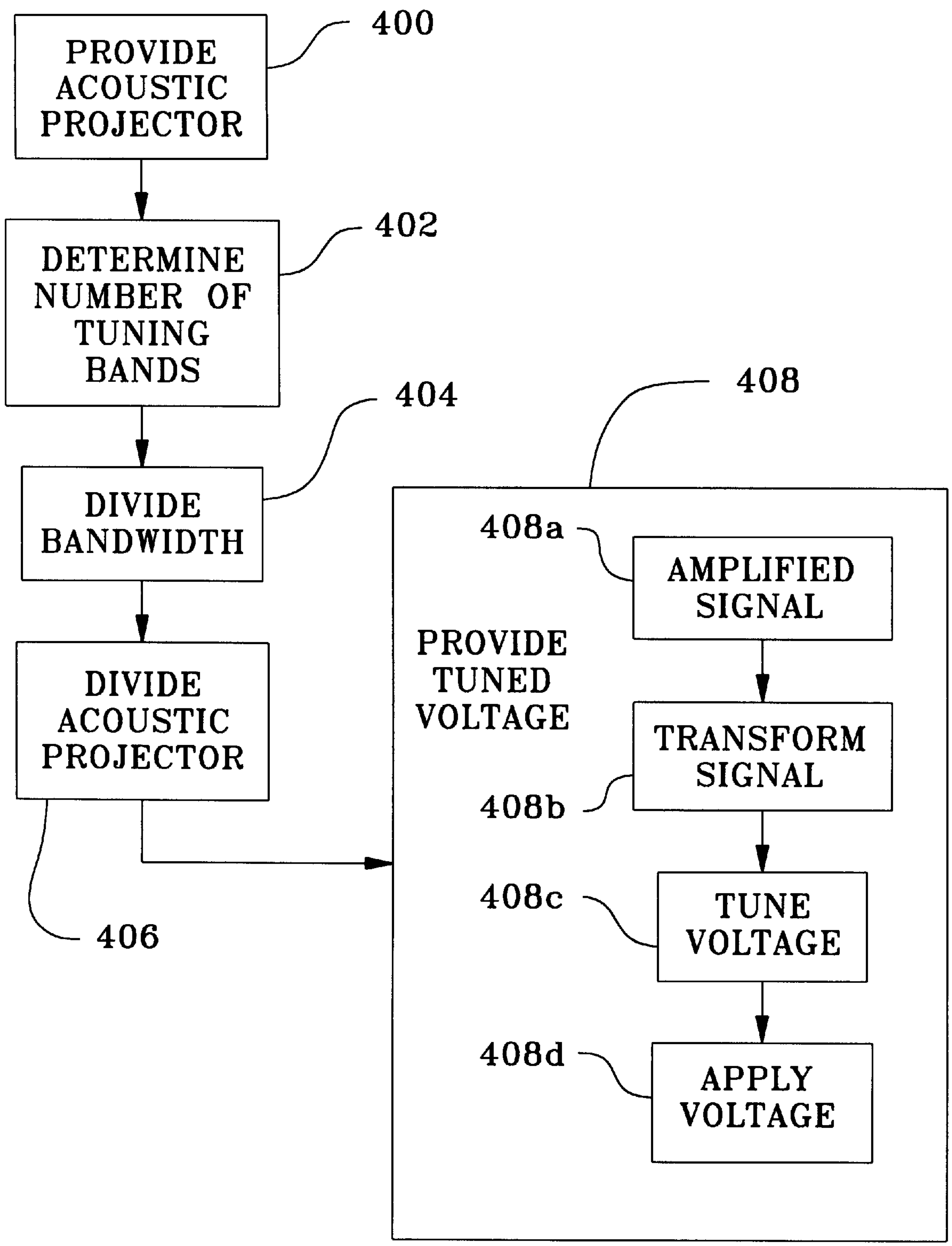
FIG. 5 is a block diagram of the method of operating an acoustic projector with multiple tuning network assemblies in accordance with the present invention.

In the general case, the method of providing a multi-tuned acoustic projector is illustrated by the steps shown in FIG. 5. Step 400 provides the wide bandwidth acoustic projector which will be multi-tuned. In step 402, the number of tuning bands are determined based on the bandwidth and number of ceramic elements in the projector. For example, in a flextensional acoustic projector such as FIG. 1, the upper limit to the number of tuning bands is the number of ceramic elements 106 in the stack 104. Similarly, for a split ring acoustic projector such as FIG. 4A, the upper limit to the number of tuning bands is the number of ceramic rings. For a cylindrical projector such as FIG. 3, the upper limit to the number of tuning bands is the number of pairs of ceramic elements 202*a*. The number of tuning bands will also depend on the power savings desired. Additional power can be saved utilizing additional tuning bands, however, the driving circuitry becomes increasingly complex. To provide the greatest reduction in reactive power requirements, the number of tuning bands should be a whole number divisor of the number of ceramic elements, rings or pairs of elements. Once the number of tuning bands is determined, the bandwidth is divided into a corresponding number of portions at step 404. Step 406 divides the acoustic projector into a corresponding number of sub-elements. For example, the flextensional acoustic projector of FIG. 2 was divided into two stacks, or sub-elements, corresponding to the two tuning bands. Step 408 provides a tuned voltage corresponding to each portion of the bandwidth across a corresponding sub-element of the acoustic projector. Step 408 may also be broken into the intermediate steps of: providing at step 408*a*, for each portion of the bandwidth, a corresponding amplified signal; transforming each of the amplified signals to a voltage at step 408*b*; tuning the voltage to the center of the corresponding portion of the bandwidth at step 408*c*; and applying the tuned voltage across the corresponding sub-element at step 408*d*.

The invention thus described provides a system and method for driving an acoustic projector with reduced power being dissipated in the amplifiers and reduced overall power supply requirements. The acoustic projector is driven by multiple tuning network assemblies each driving a sub-element of the projector over a corresponding portion of the bandwidth. Since power supplies generally increase in size and weight with increasing power requirements, an acoustic projector of the current invention is useful in applications which are space and weight limited, such as broadband noise acoustic countermeasures.

Although the present invention has been described relative to specific embodiments thereof, it is not so limited. The multi-tuned acoustic projector system and method can be used to drive most wide bandwidth acoustic projectors consisting of multiple sub-elements which can be independently driven. Also, though the embodiments shown in FIGS. 2–4 utilize an inductor for tuning the voltage, any method of tuning can be employed. As in FIG. 2B, the embodiments of FIGS. 3–4 can be configured for series tuning.

Thus, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. An operating system for a wide bandwidth cylindrical acoustic projector having a plurality of electrically conductive elements spaced circumferentially about the projector the system comprising:

a plurality of signal amplifiers, each amplifier providing a signal corresponding to a separate portion of the bandwidth of the acoustic projector, the total of the signals corresponding to the total bandwidth; and a plurality of tuning means, each tuning means associated with one of the amplifiers, each tuning means receiving the signal from the one amplifier, providing a tuned voltage corresponding to the signal and applying the tuned voltage across a separate portion of the acoustic projector between adjacent conductive elements, the portions of the acoustic projector forming the complete acoustic projector.

2. The system of claim 1 wherein each one of the plurality of tuning means further comprises:

a transformer receiving the signal from the one amplifier and providing an output voltage at output terminals thereof;

a tuning inductor connected across the output terminals, the tuning inductor tuning the output voltage to the center of the portion of the bandwidth corresponding to the signal.

3. The system of claim 1 wherein each one of the plurality of tuning means further comprises:

a transformer receiving the signal from the one amplifier and providing an output voltage at output terminals thereof;

a tuning inductor connected in series between one of the output terminals and the separate portion of the acoustic projector, the tuning inductor tuning the output voltage to the center of the portion of the bandwidth corresponding to the signal.

4. The system of claim 1 wherein the acoustic projector is a tangentially polarized ceramic cylindrical acoustic projector.

5. A method for operating a wide bandwidth cylindrical acoustic projector, the method comprising the steps of:

providing a cylindrical acoustic projector;

determining a number of tuning bands;

dividing the bandwidth into bandwidth portions corresponding to the number of tuning bands;

dividing the acoustic projector into sub-elements using electrically conductive elements, the number of sub-elements corresponding to the number of tuning bands; and, applying a voltage across each sub-element, the voltage across each sub-element separately tuned to a center of one of the bandwidth portions.

6. The method of claim 5 wherein the voltage applying step further comprises the steps of:

separately amplifying signals corresponding to each bandwidth portion;

transforming each amplified signal to a voltage; and tuning the voltage to a center of the corresponding bandwidth portion.

7. The system of claim 1 wherein:

the plurality of conductive elements total a multiple of four times the plurality of amplifiers;

common potential outputs of the amplifiers are electrically connected to each other and to alternating conductive elements; and a second output of each amplifier is electrically connected in turn to one of the conductive elements not connected to the common potential outputs such that all conductive elements not connected to the common potential output, connect to the second output of one of the amplifiers.

8. The method of claim 5 further comprising the steps of:

electrically connecting together common potential outputs from the plurality of amplifiers;

electrically connecting the common potential outputs to alternating conductive elements; and electrically connecting in turn a second output from each of the plurality of amplifiers to one of the conductive elements not connected to the common potential outputs such that all conductive elements not connected to the common potential outputs connect to the second output of one of the amplifiers.

* * * * *